(12) United States Patent
Lee et al.

(10) Patent No.: US 11,146,304 B2
(45) Date of Patent: Oct. 12, 2021

(54) TRANSCEIVER DEVICE

(71) Applicant: REALTEK SEMICONDUCTOR CORPORATION, Hsinchu (TW)

(72) Inventors: Chia-Yi Lee, Hsinchu (TW); Kuan-Yu Shih, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/080,890

(22) Filed: Oct. 27, 2020

(65) Prior Publication Data
US 2021/0143861 A1    May 13, 2021

(30) Foreign Application Priority Data

Nov. 7, 2019 (TW) .................................. 108140379

(51) Int. Cl.
*H04L 5/12* (2006.01)
*H04L 23/02* (2006.01)
*H04B 1/405* (2015.01)
*H03H 19/00* (2006.01)
*H04B 1/44* (2006.01)

(52) U.S. Cl.
CPC ........... *H04B 1/405* (2013.01); *H03H 19/002* (2013.01); *H04B 1/44* (2013.01)

(58) Field of Classification Search
CPC ......... H04B 1/405; H04B 1/44; H03H 19/002
USPC ....................................................... 375/262
See application file for complete search history.

(56) References Cited

U.S. PATENT DOCUMENTS

| | | | |
|---|---|---|---|
| 3,531,741 A | 9/1970 | Langer | |
| 7,953,366 B2* | 5/2011 | Couet | H04B 3/52 455/20 |
| 10,084,433 B2* | 9/2018 | Lu | H03D 7/165 |
| 10,917,132 B1* | 2/2021 | Wyse | H04B 1/16 |
| 2011/0299618 A1 | 12/2011 | Hammerschmidt et al. | |
| 2014/0170999 A1* | 6/2014 | Aparin | H03G 3/3078 455/132 |
| 2015/0063509 A1* | 3/2015 | Hedayati | H04B 1/26 375/350 |

(Continued)

OTHER PUBLICATIONS

Realtek Semiconductor Corp., "Wireless Transceiver Device",TW 108129370 Filing date:Aug. 16, 2019 (YYYY-MM-DD).

(Continued)

*Primary Examiner* — Tanmay K Shah
(74) *Attorney, Agent, or Firm* — WPAT, PC

(57) ABSTRACT

A transceiver device includes a digital baseband circuit, a first circuit portion, and a second circuit portion. The digital baseband circuit is configured to analyze power of an input signal, in order to generate a first control signal and a second control signal. The first circuit portion has a first gain, and is configured to be selected according to the first control signal to process the input signal to generate output signals. The second circuit portion has a second gain higher than the first gain, and is configured to be selected according to the second control signal to process the input signal to generate the output signals. The first circuit portion includes an N-way filter circuit, and the N-way filter circuit is configured to modulate the input signal according to first oscillating signals to perform a filtering operation.

15 Claims, 3 Drawing Sheets

(56) References Cited

U.S. PATENT DOCUMENTS

2015/0207536 A1* 7/2015 Yehezkely ............... H01Q 3/24
455/78

OTHER PUBLICATIONS

OA letter of the counterpart TW application (appl. No. 108140379) mailed on Sep. 24, 2020. Summary of the OA letter: 1.Claims 1-2 and 9 are rejected as allegedly being unpatentable over a first cited reference (US 2011/0299618A1) in view of a second cited reference (US 2015/0063509A1). 2.Claims 3-8 and 10 are allowable.

* cited by examiner

TRANSCEIVER DEVICE

BACKGROUND OF THE INVENTION

1. Field of the Invention

The present disclosure relates to a transceiver device. More particularly, the present disclosure relates to a transceiver device that includes an N-way filter and a low noise amplifier having a fixed gain.

2. Description of Related Art

In order to process input signals having different power, a low noise amplifier in a transceiver device is commonly to have a variable gain. In current approaches, the low noise amplifier utilizes a negative feedback mechanism to achieve the function of the variable gain. However, this negative feedback mechanism may introduce certain non-ideal parasitic effect(s), resulting in decreased gain and decreased noise performance of the low noise amplifier.

SUMMARY OF THE INVENTION

In some embodiments, a transceiver device includes a digital baseband circuit, a first circuit portion, and a second circuit portion. The digital baseband circuit is configured to analyze power of an input signal, in order to generate a first control signal and a second control signal. The first circuit portion has a first gain, and is configured to be selected according to the first control signal to process the input signal to generate a plurality of output signals. The second circuit portion has a second gain higher than the first gain, and is configured to be selected according to the second control signal to process the input signal to generate the plurality of output signals. The first circuit portion includes an N-way filter circuit, and the N-way filter circuit is configured to modulate the input signal according to a plurality of first oscillating signals to perform a filtering operation.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals. As used herein, the term "and/or" includes any and all combinations of one or more of the associated listed items.

Figure 1:
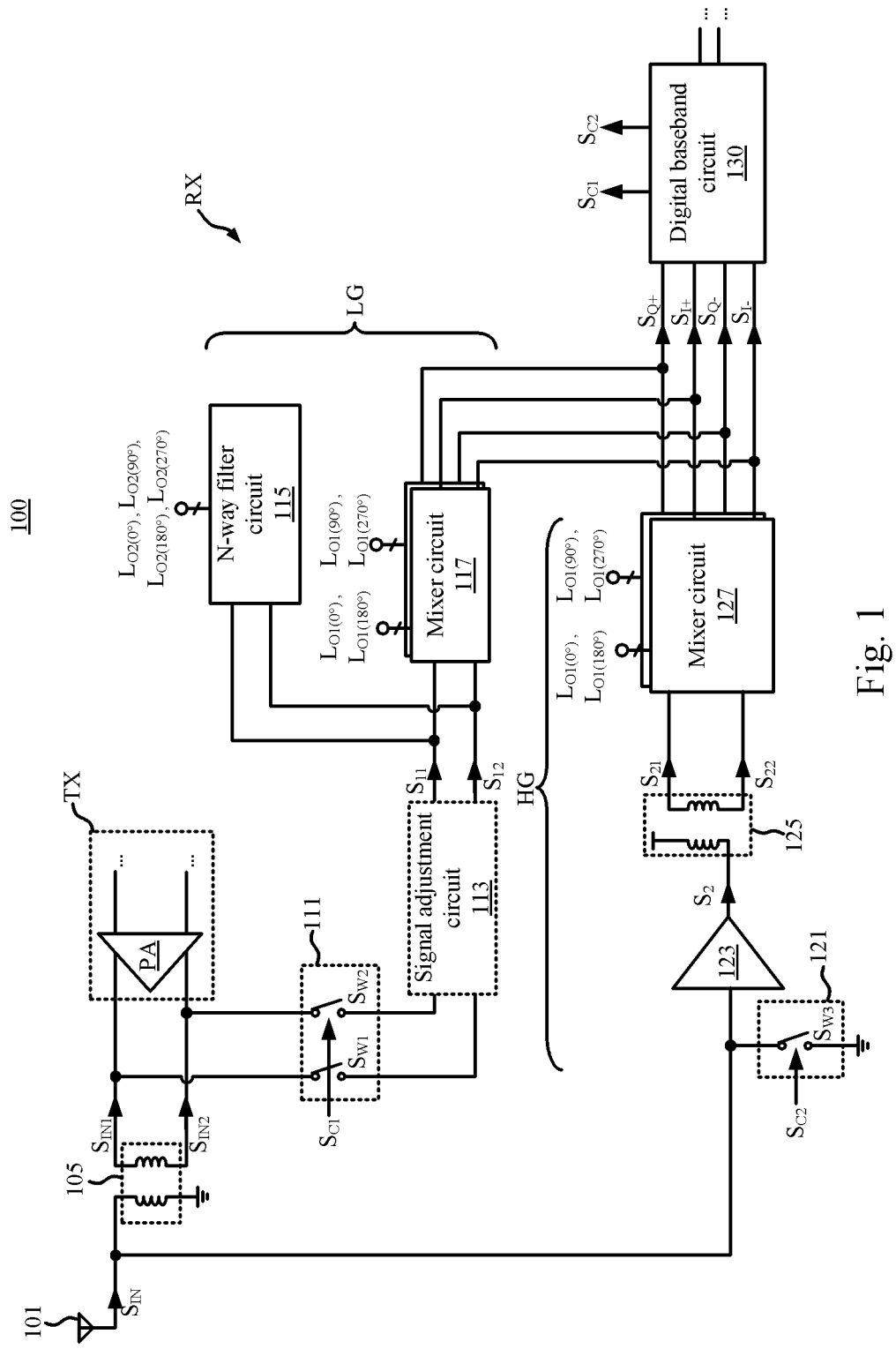
FIG. 1 illustrates a schematic diagram of a transceiver device according to some embodiments of the present disclosure.

FIG. 1 illustrates a schematic diagram of a transceiver device 100 according to some embodiments of the present disclosure. In some embodiments, the transceiver device 100 may be applied to wireless signal transmission.

The transceiver device 100 includes an antenna 101, an isolation circuit 105, a transmitter circuit TX, a receiver circuit RX, and a digital baseband circuit 130. The antenna 101 receives an input signal $S_{IN}$, and transmits the same to the isolation circuit 105 and the receiver circuit RX. The isolation circuit 105 converts the received input signal $S_{IN}$ to differential signals $S_{IN1}$ and $S_{IN2}$, and transmits the signal $S_{IN1}$ and the signal $S_{IN2}$ to the receiver circuit RX. The transmitter circuit TX includes a power amplifier circuit PA. The isolation circuit 105 is coupled to output terminals of the power amplifier circuit PA, in order to convert differential outputs generated from the transmitter circuit TX (not shown) to a single signal (not shown) that is to be transmitted via the antenna 101.

In some embodiments, the receiver circuit RX includes a circuit portion LG and a circuit portion HG. The circuit portion LG has a first gain, and is configured to filter out high frequency components in the input signal $S_{IN}$. The circuit portion HG has a second gain higher than the first gain, and is configured to amplify the input signal $S_{IN}$. One of the circuit portion LG and the circuit portion HG is selected to process the input signal $S_{IN}$, in order to generate an output signal $S_{Q+}$, an output signal $S_{I+}$, an output signal $S_{Q-}$, and an output signal $S_{I-}$. The digital baseband circuit 130 is configured to analyze power of the input signal $S_{IN}$ to output a control signal $S_{C1}$ and a control signal $S_{C2}$, in order to select one of the circuit portion LG and the circuit portion HG to process the input signal $S_{IN}$.

In some embodiments, the digital baseband circuit 130 analyzes the power of the input signal $S_{IN}$ according to the output signal $S_{Q+}$, the output signal $S_{I+}$, the output signal $S_{Q-}$, and the output signal $S_{I-}$, in order to output the control signal $S_{C1}$ and the control signal $S_{C2}$. For example, the digital baseband circuit 130 may include an analog to digital converter (ADC) circuit (not shown) and a power estimation circuit (not shown). In an initial state, the circuit portion HG is given priority to be selected to process the input signal $S_{IN}$ to generate the output signal $S_{Q+}$, the output signal $S_{I+}$, the output signal $S_{Q-}$, and the output signal $S_{I-}$. In response to the output signal $S_{Q+}$, the output signal $S_{I+}$, the output signal $S_{Q-}$, and the output signal $S_{I-}$, the ADC circuit generates digital data to the power estimation circuit. The power estimation circuit determines whether the power of the input signal $S_{IN}$ exceeds a predetermined power according to bits of the digital data, in order to output the control signal $S_{C1}$ and the control signal $S_{C2}$. For example, if a time interval when all bits of the digital data are logic values of 1 exceeds a predetermined time, the power estimation circuit determines that the power of the input signal $S_{IN}$ is too high, and thus outputs the control signal $S_{C1}$ having a first logic value and the control signal $S_{C2}$ having a second logic value. Under this condition, the circuit portion LG is selected to process the input signal $S_{IN}$, and the circuit portion HG is disabled and does not process the input signal $S_{IN}$. Alternatively, under other conditions, the power estimation circuit outputs the control signal $S_{C1}$ having the second logic value and the control signal $S_{C2}$ having the first logic value. Under this condition, the circuit portion HG is selected to process the input signal $S_{IN}$, and the circuit portion LG is disabled and does not process the input signal $S_{IN}$. The first logic value and the second logic values are complemented logic values (e.g., the logic value of 1 and the logic value of 0).

In some embodiments, in the initial state, the circuit portion LG may be given priority to be selected to process the input signal $S_{IN}$. In some embodiments, the power estimation circuit may be implemented with one or more digital signal processing circuits that perform the above operations of analyzing power. The circuit configurations and the operations of analyzing power of the digital baseband circuit 130 are given for illustrative purposes, and the present disclose is not limited thereto.

In greater detail, the circuit portion LG includes a switching circuit 111, a signal adjustment circuit 113, an N-way filter circuit 115, and mixer circuits 117. The switching circuit 111 is configured to be selectively turned on according to the control signal $S_{C1}$, in order to receive the signal $S_{IN1}$ and the signal $S_{IN2}$ from the isolation circuit 105.

For example, the switching circuit 111 includes a switch $S_{W1}$ and a switch $S_{W2}$. A terminal of the switch $S_{W1}$ is coupled to a terminal of the isolation circuit 105 in order to receive the signal Sim, and another terminal of the switch $S_{W1}$ is coupled to the signal adjustment circuit 113. A terminal of the switch $S_{W2}$ is coupled to another terminal of the isolation circuit 105 in order to receive the signal $S_{IN2}$, and another terminal of the switch $S_{W2}$ is coupled to the signal adjustment circuit 113. The switch $S_{W1}$ and the switch $S_{W2}$ are turned on (i.e., closed) in response to the control signal $S_{C1}$ having the first logic value, in order to transmit the signal $S_{IN1}$ and the signal $S_{IN2}$ to the signal adjustment circuit 113. In other words, when the switch $S_{W1}$ and the switch $S_{W2}$ are turned on, the circuit portion LG is selected to process the input signal $S_{IN}$.

In some embodiments, the configuration of the switching circuit 111 may be similar with that of the switching circuit 121. In some embodiments, the function of the switching circuit 111 may be integrated into other circuits of the circuit portion LG. For example, in some embodiments, the mixer circuits 117 may be powered in response to the control signal $S_{C1}$ having the first logic value, in order to process the input signal $S_{IN}$. The configuration of the switching circuit 111 is given for illustrative purposes, and the present disclosure is not limited thereto.

The signal adjustment circuit 113 is configured to provide to a gain to process the signal $S_{IN1}$ and the signal $S_{IN2}$ to output a signal $S_{11}$ and a signal $S_{12}$. In some embodiments, as shown in the following FIG. 3A, the gain of the signal adjustment circuit 113 is for amplifying the signal $S_{IN1}$ and the signal $S_{IN2}$. In some embodiments, as shown in the following FIG. 3B, the gain of the signal adjustment circuit 113 is for attenuating the signal $S_{IN1}$ and the signal $S_{IN2}$. The gain of the signal adjustment circuit 113 may be set according to practical requirements. In some embodiments, the circuit portion LG may directly output the signal Sim and the signal $S_{IN2}$ as the signal $S_{11}$ and the signal $S_{12}$ without the signal adjustment circuit 113. In these embodiments, the function of the signal adjustment circuit 113 may be integrated into the digital baseband circuit 130.

In some embodiments, the N-way filter circuit 115 is configured to modulate the input signal $S_{IN}$ according to oscillating signals $L_{O2}$ having different phases, in order to perform a filtering operation. For example, the N-way filter circuit 115 is coupled to the signal adjustment circuit 113, and modulates the signal $S_{11}$ and the signal $S_{12}$ according to the oscillating signals $L_{O2}$, in order to perform the filtering operation. As a result, high frequency signal components in the signal $S_{11}$ and the signal $S_{12}$ can be removed, in order to improve the anti-interference ability of the transceiver device 100. In some embodiments, the N-way filter circuit 115 is configured to provide a bypass path, in order to bypass the high frequency signal components to ground to achieve the filtering operation. In some embodiments, the N-way filter circuit 115 operates as a band pass filter. In some embodiments, the frequency of the oscillating signal $L_{O2}$ is for setting the bandwidth of a pass band of the band pass filter. The configuration of the N-way filter circuit 115 is described in the following paragraphs with reference to FIG. 2.

The mixer circuits 117 are configured to modulate the signal $S_{11}$ and the signal $S_{12}$ according to the oscillating signals $L_{O1}$ having different phases, in order to generate an output signal $S_{I+}$, an output signal $S_{I-}$, an output signal $S_{Q+}$, and an output signal $S_{Q-}$. For example, a first mixer circuit 117 is an in-phase signal processing circuit that modulates the signal $S_{11}$ and the signal $S_{12}$ according to the oscillating signals $L_{O1}$ having a phase of 0 degree and a phase of 180 degrees, in order to generate the output signal $S_{I+}$ and the output signal $S_{I-}$. A second the mixer circuit 117 is a quadrature signal processing circuit that modulates the signal $S_{11}$ and the signal $S_{12}$ according to the oscillating signals $L_{O1}$ having a phase of 90 degrees and a phase of 270 degrees, in order to generate the output signal $S_{Q+}$ and the output signal $S_{Q-}$.

The circuit portion HG includes a switching circuit 121, a low noise amplifier circuit 123, an isolation circuit 125, and mixer circuits 127. The switching circuit 121 is configured to be selectively turned on according to the control signal $S_{C2}$, in order to disable (or select) the circuit portion HG. For example, the switching circuit 121 includes a switch $S_{W3}$. A terminal of the switch $S_{W3}$ is coupled to the antenna 101 and an input terminal of the low noise amplifier circuit 123, and another terminal of the switch $S_{W3}$ is coupled to ground. The switch $S_{W3}$ is turned on in response to the control signal $S_{C2}$ having the second logic value, in order to bypass the input signal $S_{IN}$ to ground. In other words, when the switch $S_{W3}$ is turned on, the circuit portion HG is disabled to bypass the input signal $S_{IN}$ to ground, such that the low noise amplifier circuit 123 is unable to amplify the input signal $S_{IN}$. Alternatively, when the switch $S_{W3}$ is turned off (i.e., open) the input signal $S_{IN}$ is transmitted to the low noise amplifier circuit 123. Under this condition, the circuit portion HG is selected to process the input signal $S_{IN}$.

In this example, the switch $S_{W3}$ and a signal path that transmits the input signal $S_{IN}$ are coupled in parallel with each other. Compared with a configuration in which a switch and the signal path that transmits the input signal $S_{IN}$ are coupled in series, such configuration can reduce signal loss.

The configurations of the switching circuit 121 are given for illustrative purposes, and the present disclosure is not limited thereto.

The low noise amplifier circuit 123 is configured to have a fixed gain, and to amplify the input signal $S_{IN}$ to generate a signal $S_2$. The isolation circuit 125 is configured to convert the signal $S_2$ to differential signals $S_{21}$ and $S_{22}$.

Similar to the mixer circuits 117, the mixer circuits 127 are configured to modulate the signal $S_{21}$ and the signal $S_{22}$ according to the oscillating signals $L_{O1}$ having different phases, in order to generate the output signal $S_{I+}$, the output signal $S_{I-}$, the output signal $S_{Q+}$, and the output signal $S_{Q-}$. For example, a first mixer circuit 172 is an in-phase signal processing circuit that modulates the signal $S_{21}$ and the signal $S_{22}$ according to the oscillating signals $L_{O1}$ having the phase of 0 degree and the phase of 180 degrees, in order to generate the output signal $S_{I+}$ and the output signal $S_{I-}$. A second mixer circuit 127 is a quadrature signal processing circuit that modulates the signal $S_{21}$ and the signal $S_{22}$ according to the oscillating signals $L_{O1}$ having the phase of 90 degrees and the phase of 270 degrees, in order to generate the output signal $S_{Q+}$ and the output signal $S_{Q-}$.

In some related approaches, a transceiver device utilizes a low noise amplifier having a variable gain to process a received input signal. In these approaches, the low noise amplifier utilizes a negative feedback mechanism to achieve the variable gain, in order to process the input signal having different power. However, certain non-ideal parasitic effects may be introduced from the negative feedback mechanism, such that the gain or the noise performance at the high gain of the low noise amplifier may be degraded.

Compared with these approaches, as mentioned above, the low noise amplifier circuit 123 is configured to have a fixed gain. When the input signal $S_{IN}$ has a lower power, the low noise amplifier circuit 123 processes the input signal $S_{IN}$ without utilizing the negative feedback mechanism, in order to prevent impacts of the parasitic effects. Moreover, when the input signal $S_{IN}$ has a higher power, the circuit portion LG is selected, and the N-way filter circuit 115 is able to filter out the high frequency components in the signal $S_{11}$ and the signal $S_{12}$, in order to increase the anti-interference ability of the transceiver device 100.

In some embodiments, the frequency of the oscillating signal $L_{O1}$ may be the same as or different from the frequency of the oscillating signal $L_{O2}$. The number of phases of the oscillating signals $L_{O1}$ and $L_{O2}$ is given for illustrative purposes, and the present disclosure is not limited thereto. In some embodiments, each of the isolation circuit 105 and the isolation circuit 125 may be implemented with a coil or a winding.

Figure 2:
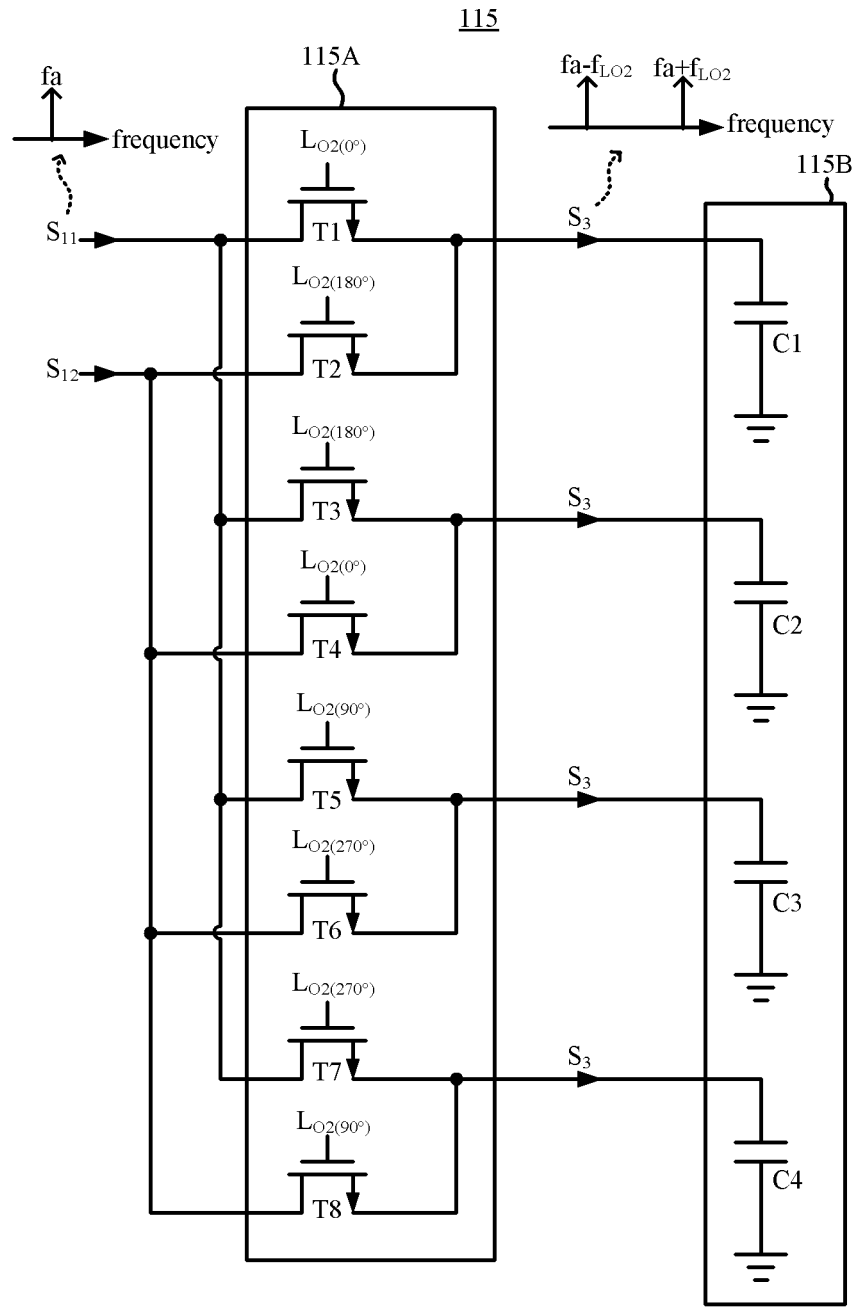
FIG. 2 illustrates a schematic diagram of the N-way filter circuit in FIG. 1 according to some embodiments of the present disclosure.

FIG. 2 illustrates a schematic diagram of the N-way filter circuit 115 in FIG. 1 according to some embodiments of the present disclosure. The N-way filter circuit 115 includes a mixer circuit 115A and an impedance circuit 115B.

The mixer circuit 115A is configured to modulate the signal $S_{11}$ and the signal $S_{12}$ according to the oscillating signals $L_{O2}$ having different phases, in order to generate signals $S_3$. The impedance circuit 115B is configured to provide a bypass path, in order to transmit the signals $S_3$ to ground. For example, the mixer circuit 115A includes switches T1-T8, and the impedance circuit 115B includes capacitors C1-C4. Taking the switch T1, the switch T2, and the capacitor C1 as an example, the oscillating signals $L_{O2}$ that are respectively received by the switch T1 and the switch T2 are different in phase by 180 degrees. A first terminal of the switch T1 is configured to receive the signal $S_{11}$, and a control terminal of the switch T1 is configured to receive the oscillating signals $L_{O2}$ having the phase of 0 degree. A first terminal of the switch T2 is configured to receive the signal $S_{12}$, and a control terminal of the switch T2 is configured to receive the oscillating signals $L_{O2}$ having the phase of 180 degrees. A second terminal of the switch T1 and a second terminal of the switch T2 are configured to output the signal $S_3$. A first terminal of the capacitor C1 is coupled to the second terminal of the switch T1 and the second terminal of the switch T2 to receive the signal $S_3$, and a second terminal of the capacitor C1 is coupled to ground. Connections among the remaining switches T3-T8 and the remaining capacitors C2-C4 are similar to those among the switch T1, the switch T2, and the capacitor C1, and thus the repetitious descriptions are not further given.

As mentioned above, the signal $S_{11}$ and the signal $S_{12}$ are differential signals, and thus the signal $S_{11}$ and the signal $S_{12}$ have the same frequency. For example, the signal $S_{11}$ (and the signal $S_{12}$) includes a signal component having a frequency fa. In response to the modulations of the switches T1 and T2, the signal $S_3$ includes a signal component having a frequency fa-$f_{LO2}$ and a signal component having a frequency of fa+$f_{LO2}$, in which $f_{LO2}$ is the frequency of the oscillating signal $L_{O2}$. In some embodiments, the capacitance value of each of the capacitors C1-C4 can be set according to the frequency $f_{LO2}$, in order to set the bandwidth of the pass band.

For example, when the frequency fa is about the same as the frequency $f_{LO2}$, the frequency fa-$f_{LO2}$ is closed to a direct current (DC) frequency. Under this condition, the capacitor C1 offers a high impedance (which is equivalent to open-circuit) to the signal $S_{11}$ (and the signal $S_{12}$), and thus the signal $S_{11}$ (and the signal $S_{12}$) cannot be bypassed to ground via the N-way filter circuit 115 (which is equivalent to a response of a stop band, at the low frequency, of the N-way filter circuit 115). Under this condition, the signal components having the frequency fa are mainly transmitted to the mixer circuits 117 rather than the N-way filter circuit 115. When the frequency fa is higher than the frequency $f_{LO2}$, the frequency fa-$f_{LO2}$ is higher. Under this condition, the impedance offered by the capacitor C1 to the signal $S_{11}$ (and the signal $S_{12}$) becomes lower, and thus the signal $S_1$ (and the signal $S_{12}$) starts being bypassed to ground via the N-way filter circuit 115 (which is equivalent to a response of a pass band of the N-way filter circuit 115). Under this condition, the signal components having the frequency fa are mainly transmitted to the N-way filter circuit 115 rather than the mixer circuits 117. Moreover, as the frequency fa+$f_{LO2}$ is quiet high, the energy of the signal component having the frequency of fa+$f_{LO2}$ will be attenuated spontaneously (which is equivalent to a response of a stop band, at the high frequency, of the N-way filter circuit 115). Accordingly, the frequency response of the N-way filter circuit 115 can be set according to the frequency $f_{LO2}$.

With such configuration, when the input signal $S_{IN}$ has a higher power, high frequency signal components (e.g., signal components having a frequency higher than the frequency $f_{LO2}$) in the input signal $S_{IN}$ are mainly bypassed to ground through the N-way filter circuit 115. As a result, the power of the high frequency components received by the mixer circuits 117 are reduced, and thus the high frequency interference are reduced.

The configurations of the N-way filter circuit 115 are given for illustrative purposes, and the present disclosure is not limited thereto. For example, the impedance circuit 115B may also include passive components (e.g., resistor(s), capacitor(s), or inductor(s)) and/or active circuits. Various types of the N-way filter circuit 115 are within the contemplated scope of the present disclosure.

Figure 3A:
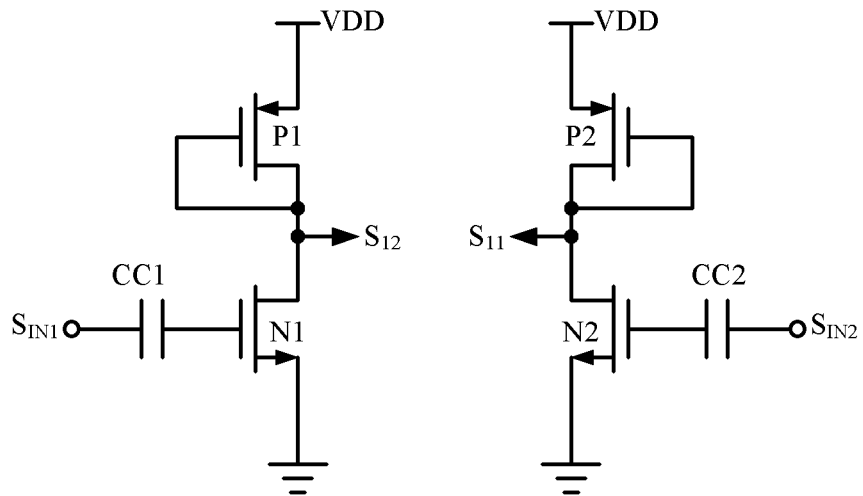
FIG. 3A illustrates a schematic diagram of the signal adjustment circuit in FIG. 1 according to some embodiments of the present disclosure.

FIG. 3A illustrates a schematic diagram of the signal adjustment circuit 113 in FIG. 1 according to some embodiments of the present disclosure. In this example, the signal adjustment circuit 113 is configured to amplify the signal $S_{IN1}$ and the signal $S_{IN2}$, in order to generate the signal $S_{11}$ and the signal $S_{12}$.

The signal adjustment circuit 113 includes transistors P1 and P2, transistors N1 and N2, and capacitors CC1 and CC2. The transistor P1, the transistor N1, and the capacitor CC1 operate as a common source amplifier circuit having an alternating current (AC) coupling mechanism, in order to amplify the signal $S_{IN1}$ n to generate the signal $S_{12}$. The transistor P2, the transistor N2, and the capacitor CC2 operate as a common source amplifier circuit having an AC coupling mechanism, in order to amplify the signal $S_{IN2}$ to generate the signal $S_{11}$.

In greater detail, a first terminal of the transistor P1 (e.g., source) receives a supply voltage VDD, and a second terminal of the transistor P1 (e.g., drain) is coupled to a control terminal of the transistor P1 (e.g., gate), in order to be configured as diode-connected. A first terminal of the transistor N1 (e.g., drain) is coupled to the second terminal of the transistor P1 to output the signal $S_{12}$, a second terminal of the transistor N1 (e.g., source) is coupled to ground, and a control terminal of the transistor N1 (e.g., gate) receives the signal $S_{IN1}$ through the capacitor CC1. A configuration among the transistor P2, the transistor N2, and the capacitor CC2 can be understood with reference to that among the transistor P1, the transistor N1, and the capacitor CC1, and thus the repetitious descriptions are not given herein. In some embodiments, the signal adjustment circuit 113 may further include a bias circuit (not shown), in order to bias the control terminals of the transistor N1 and the transistor N2.

Figure 3B:
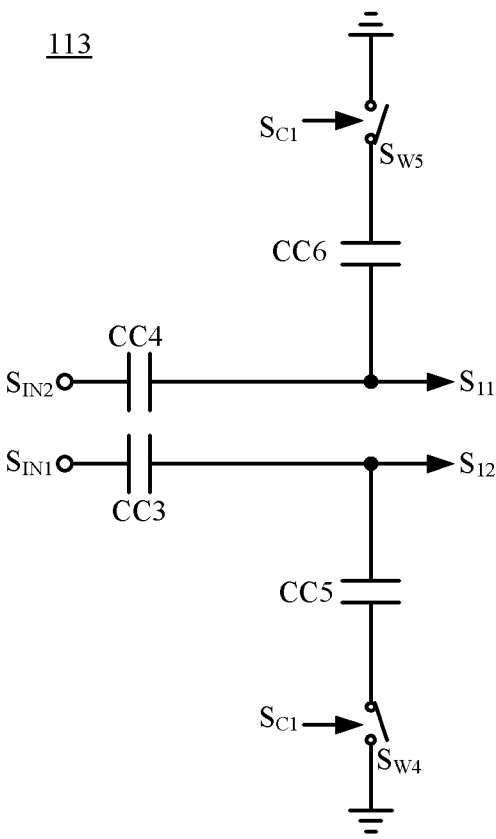
FIG. 3B illustrates a schematic diagram of the signal adjustment circuit in FIG. 1 according to some embodiments of the present disclosure.

FIG. 3B illustrates a schematic diagram of the signal adjustment circuit 113 in FIG. 1 according to some embodiments of the present disclosure. In this example, the signal adjustment circuit 113 is configured to antennae the signal Sim and the signal $S_{IN2}$, in order to generate the signal $S_{11}$ and the signal $S_{12}$.

The signal adjustment circuit 113 includes capacitors CC3-CC6 and switches $S_{W4}$ and $S_{W5}$. The capacitor CC3, the capacitor CC5, and the switch $S_{W4}$ operate as a capacitive voltage divider circuit, in order to divide the signal $S_{IN1}$ as the signal $S_{12}$. The capacitor CC4, the capacitor CC6, and the switch $S_{W5}$ operate as a capacitive voltage divider circuit, in order to divide the signal $S_{IN2}$ as the signal $S_{11}$.

In greater detail, a first terminal of the capacitor CC3 receives the signal $S_{IN1}$, and a second terminal of the capacitor CC3 outputs the signal $S_{12}$. A first terminal of the capacitor CC5 is coupled to the second terminal of the capacitor CC3, and a second terminal of the capacitor CC5 is coupled to ground through the switch $S_{W4}$. The switch $S_{W4}$ is turned on in response to the control signal $S_{C1}$, in order to divide the signal $S_{IN1}$ when the circuit portion LG is selected. A configuration among the capacitor CC4, the capacitor CC6, and the switch $S_{W5}$ can be understood with reference to that among the capacitor CC3, the capacitor CC5, and the switch $S_{W4}$, and thus the repetitious descriptions are not given herein.

In some embodiments, the signal adjustment circuit 113 may only include the capacitor CC3 and the capacitor CC4. The configurations of the signal adjustment circuit 113 are given for illustrative purposes, and the present disclosure is not limited thereto.

As described above, the transceiver device, provided in some embodiments of the present disclosure, utilizes a low noise amplifier circuit having a fixed gain to process the input signal, in order to reduce impacts from parasitic effects of the negative feedback mechanism. Moreover, when receiving the input signal having higher power, the transceiver device utilizes the N-way filter circuit to improve the anti-interference ability.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A transceiver device, comprising:
a digital baseband circuit configured to analyze power of an input signal, in order to generate a first control signal and a second control signal;
a first circuit portion having a first gain, the first circuit portion configured to be selected according to the first control signal to process the input signal to generate a plurality of output signals; and
a second circuit portion having a second gain higher than the first gain, the second circuit portion configured to be selected according to the second control signal to process the input signal to generate the plurality of output signals,
wherein the first circuit portion comprises an N-way filter circuit, the N-way filter circuit is configured to modulate the input signal according to a plurality of first oscillating signals to perform a filtering operation, and N is an integer greater than or equal to one.

2. The transceiver device of claim 1, wherein the plurality of first oscillating signals have a first frequency, and the N-way filter circuit is configured to provide a bypass path according to the first frequency, in order to perform the filtering operation.

3. The transceiver device of claim 1, wherein the first circuit portion comprises:
a switching circuit configured to be turned on according to the first control signal to receive a first signal and a second signal, wherein the first signal and the second signal are a plurality of differential signals corresponding to the input signal;

a signal adjustment circuit configured to amplify or attenuate the first signal and the second signal, in order to generate a third signal and a fourth signal; and a plurality of first mixer circuits configured to modulate the third signal and the fourth signal according to a plurality of second oscillating signals, in order to generate the plurality of output signals, wherein phases of the plurality of second oscillating signals are different from each other.

4. The transceiver device of claim 3, wherein the plurality of first oscillating signals has a first frequency, phases of the plurality of first oscillating signals are different from each other, and the N-way filter circuit is configured to modulate the third signal and the fourth signal according to the plurality of first oscillating signals, in order to filter out a signal component having a frequency higher than the first frequency in the third signal and the fourth signal.

5. The transceiver device of claim 3, wherein the plurality of first oscillating signals has a first frequency, and the N-way filter circuit is configured to provide a bypass path, in order to bypass a signal component having a frequency higher than the first frequency in the third signal and the fourth signal to ground.

6. The transceiver device of claim 3, wherein phases of the plurality of first oscillating signals are different from each other, and the N-way filter circuit comprises:

a second mixer circuit configured to modulate the third signal and the fourth signal according to the plurality of first oscillating signals, in order to generate a plurality of fifth signals; and an impedance circuit configured to provide a plurality of bypass paths, in order to bypass the plurality of fifth signals to ground.

7. The transceiver device of claim 6, wherein the second mixer circuit comprises:

a first switch configured to modulate the third signal and the fourth signal according to a signal having a first phase in the plurality of first oscillating signals, in order to generate a corresponding one of the plurality of fifth signals; and a second switch configured to modulate the third signal and the fourth signal according to a signal having a second phase in the plurality of first oscillating signals, in order to generate the corresponding one of the plurality of fifth signals.

8. The transceiver device of claim 7, wherein the first phase and the second phase are different by 180 degrees.

9. The transceiver device of claim 6, wherein the impedance circuit comprises:

a plurality of capacitors coupled between the second mixer circuit and ground, and configured to provide the plurality of bypass paths.

10. The transceiver device of claim 3, further comprising:

an isolation circuit configured to convert the input signal to the first signal and the second signal; and a transmitter circuit coupled to the isolation circuit, wherein the isolation circuit is further configured to couple an output of the transmitter circuit to an antenna.

11. The transceiver device of claim 3, wherein the signal adjustment circuit is a capacitive voltage divider, and is configured to divide the first signal and the second signal according to the first control signal, in order to generate the third signal and the fourth signal.

12. The transceiver device of claim 1, wherein the second circuit portion comprises a low noise amplifier circuit having a fixed gain, in order to provide the second gain.

13. The transceiver device of claim 1, wherein the second circuit portion comprises:

a low noise amplifier circuit having a fixed gain, the low noise amplifier circuit configured to amplify the input signal to generate a first signal;

an isolation circuit configured to convert the first signal to a second signal and a third signal, wherein the second signal and the third signal are differential signals;

a plurality of mixer circuits configured to modulate the second signal and the third signal according to a plurality of second oscillating signals, in order to generate the plurality of output signals, wherein phases of the plurality of second oscillating signals are different from each other; and a switching circuit coupled to an input terminal of the low noise amplifier circuit, and configured to be selectively turned on according to the second control signal, in order to bypass the input signal to ground.

14. The transceiver device of claim 1, wherein the digital baseband circuit is configured to analyze the power of the input signal according to the plurality of output signals, in order to output the first control signal and the second control signal.

15. The transceiver device of claim 1, wherein the N-way filter circuit operates as a pass band filter circuit.

* * * * *